(12) United States Patent
Bae et al.

(10) Patent No.: US 7,123,098 B2
(45) Date of Patent: Oct. 17, 2006

(54) TRANSIMPEDANCE AMPLIFIER WITH DIFFERENTIAL PEAK DETECTOR

(75) Inventors: Brandon Bongkee Bae, Winnetka, CA (US); Martin Sandor, Los Angeles, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/801,373

(22) Filed: Mar. 15, 2004

(65) Prior Publication Data

US 2005/0200421 A1   Sep. 15, 2005

(51) Int. Cl.
*H03F 3/08* (2006.01)

(52) U.S. Cl. .................... 330/308; 330/86; 330/282

(58) Field of Classification Search .................... None
See application file for complete search history.

(56) References Cited

U.S. PATENT DOCUMENTS

| 6,084,478 | A | 7/2000 | Mayampurath |
| 6,552,605 | B1 | 4/2003 | Yoon |
| 6,593,810 | B1 | 7/2003 | Yoon |
| 6,658,217 | B1 * | 12/2003 | Ohhata et al. ............. 330/308 |
| 6,774,727 | B1 * | 8/2004 | Bouvier ..................... 330/308 |
| 6,803,825 | B1 * | 10/2004 | Chiou et al. ................ 330/308 |

* cited by examiner

*Primary Examiner*—Khanh Van Nguyen
(74) *Attorney, Agent, or Firm*—Kacvinsky LLC; John F. Kacvinsky

(57) ABSTRACT

A method and apparatus to provide automatic gain control and offset correction in a transimpedance amplifier.

16 Claims, 3 Drawing Sheets

100

US 7,123,098 B2

TRANSIMPEDANCE AMPLIFIER WITH DIFFERENTIAL PEAK DETECTOR

BACKGROUND

A high speed optical communication system may communicate information using optical signals at various transmission speeds, such as 2.5 Gigabits Per Second (Gbps), 10 Gbps, 40 Gbps, and so forth. These optical communication systems may use a photodetector to convert the optical signals to a proportional current signal. A transimpedance amplifier (TIA) converts this current to a corresponding voltage signal for later amplification and signal processing. Because the received optical signals have varying power levels, the TIA must have a wide dynamic range. When automatic gain control and automatic offset correction features are implemented in a TIA, the offset correction signal is often used for the automatic gain control and this may negatively affect the gain control function. Consequently, there may be a need for a TIA having a robust and precise gain control which is independent of the offset control architecture.

BRIEF DESCRIPTION OF THE DRAWINGS

The subject matter regarded as embodiments is particularly pointed out and distinctly claimed in the concluding portion of the specification. The embodiments, however, both as to organization and method of operation, together with objects, features, and advantages thereof, may best be understood by reference to the following detailed description when read with the accompanying drawings in which:

DETAILED DESCRIPTION

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment. Numerous specific details may be set forth herein to provide a thorough understanding of the embodiments. It will be understood by those skilled in the art, however, that the embodiments may be practiced without these specific details. In other instances, well-known methods, procedures, components and circuits have not been described in detail so as not to obscure the embodiments. It can be appreciated that the specific structural and functional details disclosed herein may be representative and do not necessarily limit the scope of the embodiment.

Figure 1:
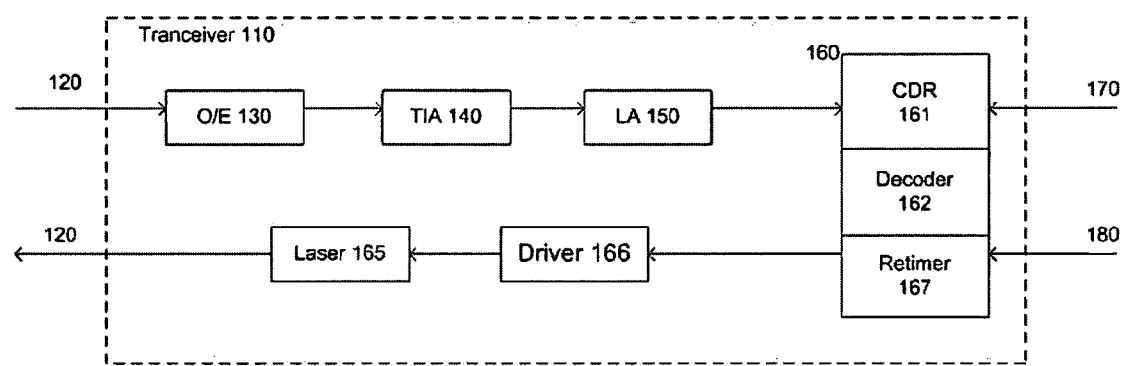
FIG. 1 illustrates a block diagram of a transceiver suitable for use in practicing one embodiment.

Referring now in detail to the drawings wherein like parts are designated by like reference numerals throughout, there is illustrated in FIG. 1 a block diagram of a high speed optical transceiver 100 suitable for practicing one embodiment. In high speed optical communication systems, information signals propagate over various distances along transmission medium 120, such as optical fiber. These signals are amplified during propagation by optical amplifiers disposed along the transmission medium and are incident on an optical receiver or transceiver 110. The power levels associated with these transmitted signals vary significantly due to a number of effects. These variations in signal power effect whether or not a particular signal is recognized by the receiver.

Transceiver 110 may include an optical to electrical (O/E) converter module or photodetector 130, transimpedance amplifier (TIA) 140, limiting amplifier 150, CDR module 160 which includes a clock and data recovery circuit (CDR) 161 and decoder 162 for the receive side and laser 165, laser driver 166 and re-timer circuit or encoder 167 for the transmit side. Re-timer circuit 167 receives information signals in electrical form from input 180 and supplies these signals to laser driver 166 which provides current variations proportional to the received information signals. Semiconductor laser 165 generates optical signals proportional to the received current levels for transmission over optical fiber 120.

The receive side of transceiver 110 receives optical information signals propagating along transmission medium 120 and outputs its electrical equivalent via output 170. The optical information signals are incident on photodetector 130 where optical energy is converted to an electrical current proportional to the received optical signals. The expression "information signals," as used herein, refers to a signal which has been coded with information. These signals are amplified during propagation by optical amplifiers disposed along the transmission medium 120 and are incident on photodetector 130 which is configured to detect an individual or range of optical wavelengths. The electrical signals generated by the photodetector may be relatively weak and require conversion to a voltage equivalent, as well as squaring-off of digital pulses, regenerating clock signals, and noise filtering induced by transmission and dark noise generated by the photodetector. The current signal generated by photodetector 130 must be converted into a corresponding voltage for further processing. This conversion is accomplished by TIA 140 which is functionally equivalent to a resistor and is typically characterized by high transimpedance on the front end and low impedance on the back end. TIA 140 provides high transimpedance with low noise amplification. Because the current signal received by TIA 140 from photodetector 130 is small, TIA 140 acts as a pre-amplifier and outputs signal amplitude ranging from a few millivolts to a few hundred millivolts. In optical communications systems the average power of the received optical signals may vary by orders of magnitude depending on span losses and fiber nonlinearities. Thus, TIA 140 must be configured to operate over a wide dynamic range of input currents from photodetector 130.

Limiting amplifier 150 functions to produce a consistent waveform in response to the input received from TIA 140. Again, because the input signal from the TIA 140 may be small, the gain level provided by the limiting amplifier 150 is significant. This gain is usually provided in multiple stages because high gain produced by a single stage amplifier is too unstable for high bandwidth communication receivers. In other words, limiting amplifier 150 increases the voltage gain of the signals received from TIA 140 so that these signals may be processed by CDR 160. CDR 160 recovers both the data and the clock signal embedded in the input data stream received by photodetector 130.

Figure 2:
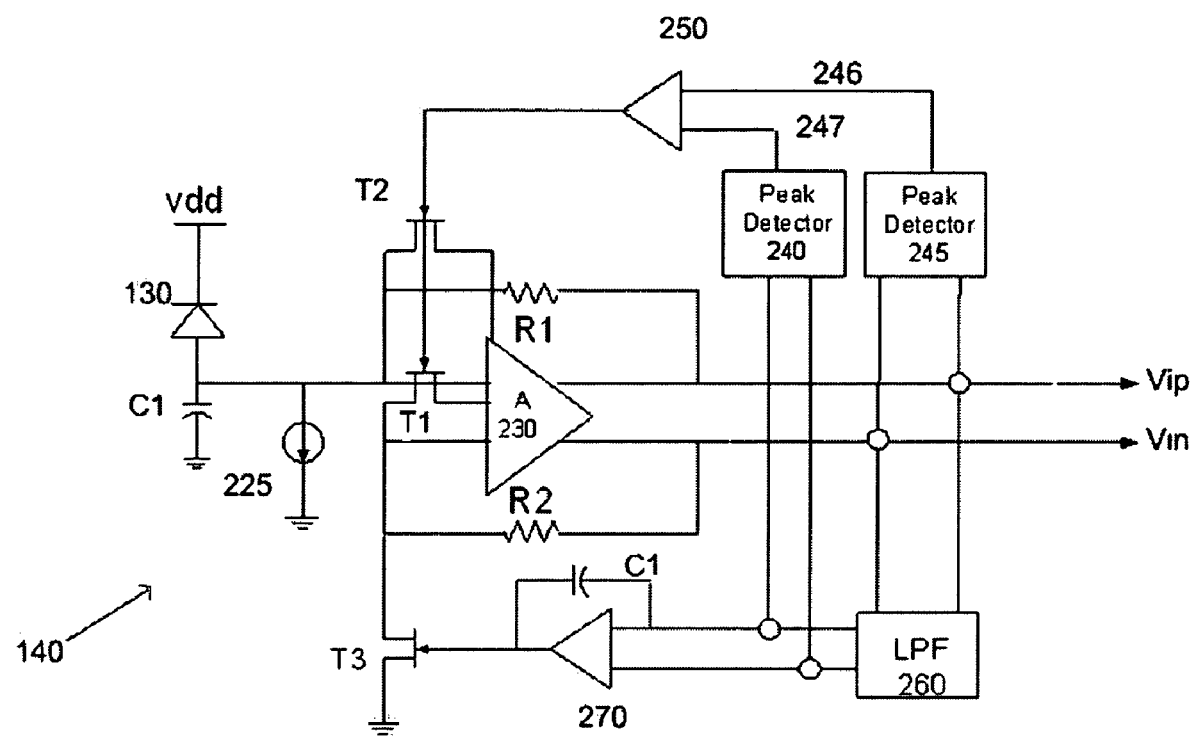
FIG. 2 illustrates a schematic diagram of transimpedance amplifier in accordance with one embodiment.

FIG. 2 illustrates a schematic diagram of TIA 140 in accordance with one embodiment. The output of the photodetector is to couple to an input of differential inverting amplifier 230 with an open loop gain of −A configured to produce outputs Vip and Vin which are typically supplied to limiting amplifier 150. Because TIA 140 must function over a wide range of input currents, automatic gain control is employed. Feed back resistors R1 and R2 are to couple across the input and outputs of amplifier 230. Because of the high input impedance of amplifier 230, the current signal from photodetector 130 supplied to the amplifier inputs is passed through the feedback resistors R1 and R2. Photodetector 130 supplies the input current to amplifier 230 essentially making the amplifier single ended. Therefore, the output will inherently be asymmetric. In addition, if the gain is fixed by feedback resistors R1 and R2 then amplifier 230 usually operates in saturation. TIA 140 receives a relatively large range of input current, thereby increasing the amplifier's dynamic range. By employing gain control transistors T1 and T2 and peak detectors 240 and 245 to monitor the output amplitude of the amplifier, however, a robust and precise gain control architecture may be achieved.

TIA 140 includes two feedback circuits to increase the dynamic range of TIA 140. The first, an automatic gain control (AGC) circuit or loop, includes peak detectors 240 and 245, DC gain amp 250, and gain control transistors T1 and T2. AGC is used in conjunction with the transimpedance amplifier in order to produce an output voltage which comprises a pulse train switched in accordance with the optical source having substantially constant amplitude over a wide range of input currents. Thus, AGC may be used to increase the dynamic range of the TIA by designing it to operate over a wide range of input currents.

A second feed back circuit, an automatic offset cancellation or control loop, includes low pass filter 260, integrator 270 in parallel with capacitor C3, and transistor T3. Offset correction or cancellation is a technique to correct amplifier output variation due to having a single input source for the differential circuit or offset produced from manufacturing induced variations in the structure of the circuit devices that comprise the amplifier. The offset control loop is separated from the gain control loop, thereby providing amplifier operating stability.

Peak detector 245 receives output signals Vip and Vin from amplifier 230 and produces a first input 246 (Vout) to DC gain amplifier 250. Low pass filter 260 also receives output signals Vip and Vin and generates an averaged voltage signal 247 (Vout_ref) which is supplied by peak detector 240. The output of peak detector 240 produces a second input 247 to DC gain amplifier 250. The gate terminals of transistors T1 and T2 are connected to the output of DC gain amp 250. The transimpedance of TIA 140 is controlled by DC gain amplifier 250. The source terminal of transistor T2 is connected to amplifier 230 and the drain is connected to feedback resistor R1. The source terminal of transistor T1 is connected to amplifier 230 and the drain is connected to feedback resistor R2. Integrator 270 is connected to low pass filter 260 and capacitor C2 is connected in parallel to integrator 270 which is connected to the gate terminal of transistor T3. Because the input to amplifier 230 is single ended, an offset exists at the output. Low pass filter 260 and integrator 270 function to vary the current in T3 such that the transistor T3 mimics photodetector 130 and the current of transistor T3 will be proportional to the amplifier offset. In this manner, if an offset exists at the amplifier output, transistor T3 corrects the offset thereby balancing the output.

Peak detectors 240 and 245 may perform as rectifiers to supply a voltage in the automatic gain control loop of TIA 140. Peak detector 245 detects the peaks of differential outputs Vip and Vin. When the output voltages Vip and Vin vary, a voltage swing is produced and peak detector 245 supplies corresponding voltage signal Vout to DC gain amp 250. Outputs Vip and Vin are also supplied to low pass filter 260 which essentially averages the output signals and filters out any AC signal components. In this manner, peak detector 245 monitors the output amplitude of amplifier 230 thereby providing improved automatic gain control provided by the gain control feedback loop.

Because outputs Vip and Vin are passed through low pass filter 260, they will have reduced voltage swing and peak detector 240 produces reference voltage Vout_ref. When the peak voltages of Vip and Vin are small, Vout=Vout_ref and DC gain amp 250 will not turn on transistors T2 and T1. When Vout exceeds Vout_ref by a nominal voltage, DC gain amp 250 turns on gain control transistors T1 and T2. By coupling the gain control transistors T1 and T2 with feedback resistors R1 and R2, the variable gain of the amplifier may be realized.

Peak detectors 240 and 245 function in the same way, but receive different input signals. Peak detector 240 receives the outputs from low pass filter 260, and peak detector 2 receives voltage signals Vip and Vin from amplifier 230. Therefore, if the DC input values to peak detector 245 increase, the DC input values to peak detector 240 also increase and the effect is cancelled out. This adds additional robustness to TIA 140.

Figure 3:
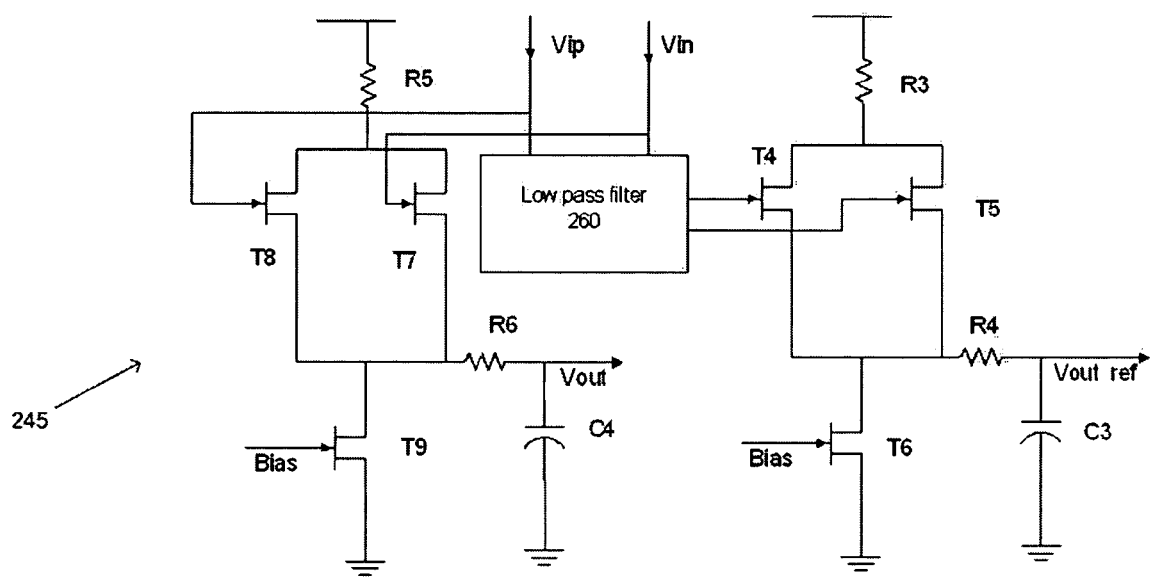
FIG. 3 illustrates a schematic diagram of peak detectors in accordance with one embodiment.

FIG. 3 is a schematic diagram of peak detectors 240 and 245 in accordance with one embodiment. Peak detector 240 includes transistors T4, T5, and T6, resistors R3 and R4 and capacitor C3. The outputs of low pass filter 260 are connected to the gate terminals of transistors T4 and T5. Resistor R3 is connected to the source terminals of transistors T4 and T5 and the drain terminals of transistors T4 and T5 are connected to resistor R4 and the source terminal of transistor T6. Bias 310 supplies a signal to the gate terminal of transistor T6 which turns the transistor on. Because outputs Vip and Vin are averaged by low pass filter 260, the signals will not have a differential peak value and Vout_ref is a voltage related to the current source that is compared to the output amplitude of Vout generated by peak detector 245.

Peak detector 245 includes transistors T7, T8 and T9, resistors R5 and R6, and capacitor C4. As can be seen from the schematic illustrations, differential peak detectors 240 and 245 have the same architecture, thereby providing stable operation and improved immunity to manufacturing process variations. Output Vip from inverting amplifier 230 is supplied to the gate terminal of transistor T8. Output Vin from inverting amplifier 230 is supplied to the gate terminal of transistor T7. Resistor R5 is connected to the source terminals of transistors T7 and T8. Drain terminals of transistors T7 and T8 are connected to resistor R6 and the source terminal of transistor T9. Capacitor C4 is coupled to resistor R6. This coupling provides a noiseless DC voltage and a stable Vout signal. The inputs to peak detector 245 (Vip and Vin) are combined via transistors T7 and T8. Depending on the peak values between these signals, Vout will increase or decrease accordingly. As discussed previously, Vout>Vout_ref if the peaks of signals Vip and Vin are relatively large and Vout=Vout_ref if the peaks of signals Vip and Vin are relatively small. Both peak detectors 240 and 245 use the same bias signal 310. Transistors T6 and T9 control the nominal threshold voltage of peak detectors 240 and 245 respectively. Peak detector 245 utilizes the bias signal, however, to determine the threshold voltage swing between outputs Vip and Vin of amplifier 230, whereas the outputs from low pass filter 260 are averaged. When no peak is detected Vout=Vout_ref, which is dependent on the bias.

The invention claimed is:

1. A transimpedance amplifier, comprising:
   a differential amplifier having an input and a first and second output;
   a low pass filter operatively responsive to said amplifier outputs; and
   an automatic gain control circuit to couple across the input and outputs of said differential amplifier to control impedance of said differential amplifier, said automatic gain control circuit comprising a direct current gain amplifier and a first peak detector to couple between said amplifier outputs and said direct current gain amplifier, and a second peak detector to couple between said direct current gain amplifier and said low pass filter.

2. The transimpedance amplifier of claim 1, wherein said amplifier input is a first amplifier input, said amplifier further comprising a second amplifier input and an offset control circuit operatively responsive between said amplifier outputs and said second amplifier input for correcting offset associated with said differential amplifier, said offset control circuit including an integrator operatively responsive to said low pass filter for integrating a first and second outputs from said low pass filter.

3. The transimpedance amplifier of claim 2, wherein said offset control circuit further comprising a transistor connected to said integrator and said second amplifier input, said transistor configured to have a current proportional to an offset associated with said differential amplifier.

4. The transimpedance amplifier of claim 1, wherein said automatic gain control circuit further comprises a gain control transistor to couple between said differential amplifier and said direct current gain amplifier.

5. The transimpedance amplifier of claim 4, wherein said gain control transistor includes a first gain control transistor, said automatic gain control circuit further comprising a second gain control transistor to couple between said first gain control transistor and said differential amplifier.

6. The transimpedance amplifier of claim 1, wherein said input includes a first amplifier input, said amplifier further comprising a second input and a first feedback resistor connected across a first of said amplifier outputs and said first input, and a second feedback resistor connected across a second of said amplifier outputs and said second amplifier input.

7. The transimpedance amplifier of claim 1, wherein said first peak detector is configured to detect peak amplitudes associated with signals at said amplifier outputs.

8. The transimpedance amplifier of claim 1, wherein said second peak detector is configured to generate a reference signal associated with said differential amplifier outputs.

9. The transimpedance amplifier of claim 1, wherein said first peak detector comprises a first and second transistors, said first transistor to couple to a first of said amplifier outputs, said second transistor to couple to a second of said amplifier inputs.

10. The transimpedance amplifier of claim 9, wherein said first peak detector further comprises a third transistor to couple to said first and second transistors, said third transistor configured to receive a bias signal to control detection of a differential voltage swing between output signals of said differential amplifier.

11. The transimpedance amplifier of claim 1, wherein said second peak detector includes a first and second transistors, said first transistor to couple to a first output of said low pass filter, said second transistor to couple to a second output of said low pass filter.

12. The transimpedance amplifier of claim 11, further including a third transistor to couple to said first and second transistors, said third transistor configured to receive a bias signal to control the nominal threshold voltage of said first peak detector.

13. The transimpedance amplifier of claim 1, wherein said transimpedance amplifier is connected to a transmission medium configured to allow propagation of optical signals.

14. A transimpedance amplifier, comprising:
   a differential amplifier having an input, a feedback input and outputs;
   an automatic gain control circuit connected across the input and outputs of said differential amplifier for controlling the impedance of said differential amplifier;
   an offset control circuit, independent of said automatic gain control circuit, connected between said amplifier feedback input and said amplifier outputs, said offset control circuit configured to correct offset associated with said differential amplifier,
   wherein said offset control circuit comprising:
      a low pass filter to couple to said differential amplifier outputs;
      an integrator to couple to said low pass filter; and
      a transistor to couple to said integrator configured to have a current proportional to said offset associated with said differential amplifier.

15. A transimpedance amplifier, comprising:
   a differential amplifier having an input, a feedback input and outputs;
   an automatic gain control circuit connected across the input and outputs of said differential amplifier for controlling the impedance of said differential amplifier;
   an offset control circuit, independent of said automatic gain control circuit, connected between said amplifier feedback input and said amplifier outputs, said offset control circuit configured to correct offset associated with said differential amplifier; and
   wherein said automatic gain control circuit comprising:
      a direct current gain amplifier;
      a first peak detector to couple between said amplifier outputs and said direct current gain amplifier configured to detect peak amplitudes associated with differential amplifier output signals; and
      a second peak detector to couple to said direct current gain amplifier.

16. The transimpedance amplifier of claim 15, wherein said automatic gain control circuit further comprises a plurality of gain control transistors to couple between said differential amplifier and said direct current gain amplifier.

* * * * *

UNITED STATES PATENT AND TRADEMARK OFFICE
CERTIFICATE OF CORRECTION

| | | |
|---|---|---|
| PATENT NO. | : 7,123,098 B2 | Page 1 of 1 |
| APPLICATION NO. | : 10/801373 | |
| DATED | : October 17, 2006 | |
| INVENTOR(S) | : Bae et al. | |

It is certified that error appears in the above-identified patent and that said Letters Patent is hereby corrected as shown below:

On Title Page, Item (56), under "U.S. Patent Documents", in column 2, line 3, after "6,593,810" delete "B1" and insert -- B2 --, therefor.

Signed and Sealed this

Second Day of January, 2007

JON W. DUDAS
*Director of the United States Patent and Trademark Office*